(12) United States Patent
Spann et al.

(10) Patent No.: US 8,455,987 B1
(45) Date of Patent: Jun. 4, 2013

(54) ELECTRICALLY ISOLATED POWER SEMICONDUCTOR PACKAGE WITH OPTIMIZED LAYOUT

(75) Inventors: Thomas Spann, Furth (DE); Holger Ostmann, Rodgau (DE); Kang Rim Choi, Cupertino, CA (US)

(73) Assignee: IXYS Corporation, Milpitas, CA (US)

( * ) Notice: Subject to any disclaimer, the term of this patent is extended or adjusted under 35 U.S.C. 154(b) by 144 days.

(21) Appl. No.: 12/771,643

(22) Filed: Apr. 30, 2010

Related U.S. Application Data (60) Provisional application No. 61/187,537, filed on Jun. 16, 2009.

(51) Int. Cl.
*H01L 23/02* (2006.01)
(52) U.S. Cl.
USPC ........... 257/675; 257/678; 257/711; 257/692; 257/E23.051; 257/E23.141; 438/106; 438/122

(58) Field of Classification Search
USPC .......... 257/675, 678, 691, E23.051, E23.141, 257/711, 692, 676; 438/106, 122
See application file for complete search history.

(56) References Cited

U.S. PATENT DOCUMENTS

| | | | |
|---|---|---|---|
| 2001/0018235 A1* | 8/2001 | Choi | 438/122 |
| 2004/0061206 A1* | 4/2004 | Son et al. | 257/675 |
| 2007/0075409 A1* | 4/2007 | Letterman et al. | 257/678 |

* cited by examiner

*Primary Examiner* — Cathy N Lam (57) ABSTRACT

A packaged power semiconductor device is provided with voltage isolation between a metal backside and terminals of the device. The packaged power semiconductor device is arranged in an encapsulant defining a hole for receiving a structure for physically coupling the device to an object. A direct-bonded copper ("DBC") substrate is used to provide electrical isolation and improved thermal transfer from the device to a heatsink. At least one power semiconductor die is mounted to a first metal layer of the DBC substrate. The first metal layer spreads heat generated by the semiconductor die. In one embodiment, the packaged power semiconductor device conforms to a TO-247 outline and is capable of receiving a screw for physically coupling the device to a heatsink.

14 Claims, 11 Drawing Sheets

ELECTRICALLY ISOLATED POWER SEMICONDUCTOR PACKAGE WITH OPTIMIZED LAYOUT

CROSS-REFERENCES TO RELATED APPLICATIONS

The present application claims priority to U.S. Provisional Patent Application No. 61/187,537, filed on Jun. 16, 2009, which is incorporated by reference in its entirety.

TECHNICAL FIELD

This invention relates to electronic devices, and more particularly to a packaged power semiconductor device having an optimized layout for facilitating electrical isolation, thermal coupling and screw mounting, where the device includes a metal back plane that is electrically isolated from the terminals of the device.

BACKGROUND OF THE INVENTION

Most power semiconductor devices like silicon-controlled rectifiers ("SCRs"), power transistors, insulated gate-bipolar transistors ("IGBTs"), metal-oxide-semiconductor field effect transistors ("MOSFETs"), power rectifiers, power regulators, or combinations thereof, are assembled in packages that fail to provide sufficient electrical isolation. That is, a metal tab, which typically forms the backside of the packaged device, is electrically coupled, e.g. soldered, to the semiconductor die within the packaged device. This places the backside of the package at the same electrical potential as the semiconductor die.

Power semiconductor devices are designed to operate at relatively high voltages, typically 30 V to 1600 V, or higher, compared to other electronic semiconductor devices, such as logic or memory devices. In a conventional packaged power semiconductor device such as that illustrated in FIG. 1A and FIG. 1B, the backside of the package may be subject to these voltages under normal operation or if a failure occurs. Additionally, the power semiconductor device may be exposed to voltages outside of the intended range during operation, which may electrically couple to the backside of the package.

The high voltages present at the backside of conventional packaged power semiconductor devices may damage other circuit components or may present a safety hazard to operating personnel or to operating equipment built with these devices. Voltages as low as 40 V can be a hazard to operators working with such equipment. Therefore insulating pads or washers are typically used to electrically isolate the backside of the power semiconductor device from the rest of the circuit. In a typical application, the power semiconductor is mounted on a heatsink that is part of an electrical chassis at ground potential.

Figure 1A:
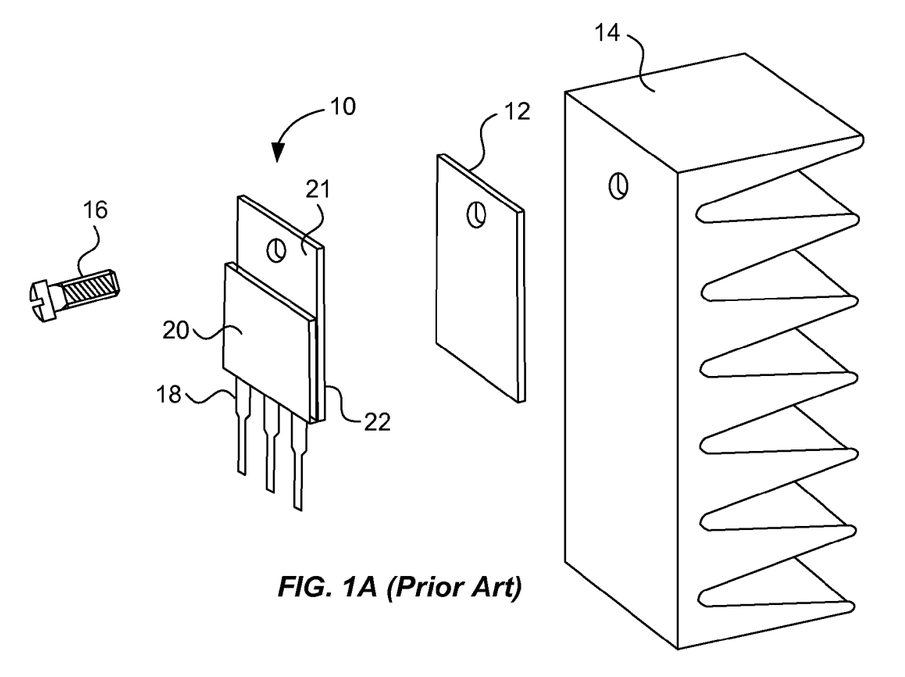
FIG. 1A is a simplified exploded view of a conventional packaged power semiconductor device mounted to a heatsink with an intervening insulating pad.

FIG. 1A illustrates a known semiconductor device providing insufficient electrical isolation. A packaged power semiconductor device 10, an insulating pad 12, a heatsink 14, and a screw 16 are provided. The screw is used to attach the semiconductor device 10 and the insulating pad 12 to the heatsink 14. The semiconductor die (not shown) is attached to a metal tab 21, leads 18 are electrically coupled to the terminal of the die, and the assembly is then encapsulated with encapsulating material 20. The encapsulating material is typically epoxy, plastic, rubber, silicone, or similar materials and is molded, cast, or otherwise formed over the die and related structures.

The heatsink 14 is usually made of a thermally conductive material such as metal, and the insulating pad 12 is typically made of an insulting material such as silicone rubber, mica, or ceramic, and may be in the form of a washer or other shape, rather than a pad. It is desirable that the insulating pad 12 provide electronic isolation between the backside 22 of the power semiconductor device 10 and the heatsink 14 while also providing good thermal coupling to the heat sink. Further improvement of thermal coupling between the semiconductor device 10, the insulating pad 12, and the heatsink 14 can be realized by applying thermal grease or phase change material between the semiconductor device 10 and the insulating pad 12 and/or between the insulating pad 12 and the heatsink 14.

Figure 1B:
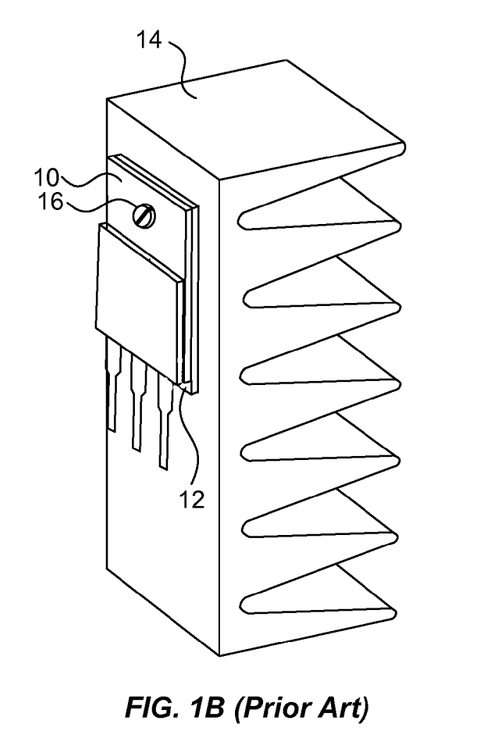
FIG. 1B is a simplified view of the assembled components shown in FIG. 1A.

FIG. 1B is a simplified view of the power semiconductor device 10 and the insulating pad 12 mounted to the heatsink 14 with the screw 16. The screw 16 can be made of an insulating material, such as nylon, or additional insulating washers and/or sleeves can be used to isolate the power semiconductor device from the heatsink. In some applications, it may be necessary to provide enhanced heatsinking Soldering the power semiconductor device 10 to the heatsink 14 will provide superior thermal coupling. However, the heatsink 14 would typically need to be isolated from the rest of the circuit or chassis, and may require a shield to prevent a technician from inadvertently touching an electrically "hot" heatsink, which could be at a lethal voltage.

An advancement of this conventional packaged power semiconductor device is the electrically isolated power semiconductor package as described in U.S. Pat. No. 6,404,065, U.S. Pat. No. 6,534,343, U.S. Pat. No. 6,583,505, and U.S. Pat. No. 6,710,463, all of which are assigned to Ixys Corp. of Milpitas, Calif., and all of which are incorporated by reference herein in their entirety.

A known semiconductor device is disclosed by Noda et. al. in U.S. Pat. No. 5,767,573. Noda discloses an intelligent power module (IPM) in which a power device and a control device are soldered onto independent lead frames. The lead frames may be attached to a metal heat sink via an insulative adhesive/solder layer, a circuit pattern layer, and an insulating layer. The components may then be encased in a molding resin, where a bottom surface of the metal heat sink is exposed.

In practice, a need has been recognized for attaching electrically isolated power semiconductor packages to objects, such as heat sinks, via the use of packages configured for widely accepted industry standards. For example, in accordance with some industry standards, packaged power semiconductor devices are mounted via a screw.

A need has also been recognized for increasing the thermal conductivity between power semiconductor packages and objects to which they are attached. For example, it is desirable to increase the thermal conductivity between power semiconductor packages that are mounted to heat sinks via a screw.

Further, a growing diversity of the range of applications for semiconductors has also increased the variations of processing and packaging. This manifests in a large number of different modules, discrete components, and IC packages that vary enormously in terms of construction, mounting and contacting structures. The construction offers numerous differences like: molded parts or plastic housings with different potting materials; base plates of copper or aluminum with or without ceramics; and structures for isolating or not isolating the base plates. The mounting and contacting structures include screws, clips, and solder. This variety provides an opportunity to find, for every application, the optimized solution in terms of easy handling (e.g. pick and place for boards), thermal management, sizing and isolation if needed.

To improve existing standard packages, it is important to maintain the package layout (e.g., footprint and size) but to extend the performance characteristics of the package.

Therefore, it is desirable to mount packaged power semiconductor devices having superior electrical isolation and thermal coupling characteristics using packages configured for industry standards. It is further desirable to mount packaged power semiconductor devices using a screw or equivalent attaching structure. It is still further desirable to increase the performance characteristics of a semiconductor device having superior electrical isolation and thermal coupling characteristics while providing the device with an industry-standard layout.

BRIEF SUMMARY OF THE INVENTION

The invention provides a packaged power semiconductor device having electrical isolation between the potential of a die inside the package and a metal back side of the package. An encapsulant defines a hole for receiving a structure for physically coupling the device to an object such as a heat sink. At least one power semiconductor die is mounted on a direct-bonded copper ("DBC") substrate. The die may be mounted using solder or other die-attach means. A lead of the package may be directly soldered to the DBC substrate, or the lead may be soldered to a connecting pad on the DBC substrate.

In some embodiments, a packaged power semiconductor device includes a substrate, a semiconductor die and an encapsulant. The substrate includes an insulating layer, a first conductive layer and a second conductive layer. The first conductive layer and the second conductive layer are provided on a first surface and a second surface of the insulating layer, respectively. The semiconductor die is provided above the first conductive layer. The encapsulant surrounds the substrate and the semiconductor die such that a portion of the second conductive layer is exposed. A hole for receiving a structure for physically coupling the packaged power semiconductor device to an object is defined in the encapsulant.

In some embodiments, the packaged power semiconductor device also includes a heatsink for dissipating heat from the packaged power semiconductor device.

A further understanding of the nature and advantages of the present invention may be realized by reference to the remaining portions of the specification and the drawings.

DETAILED DESCRIPTION OF THE INVENTION

The present invention provides a packaged power semiconductor device with superior safety, performance, manufacturability, and attachment capabilities.

Figure 2A:
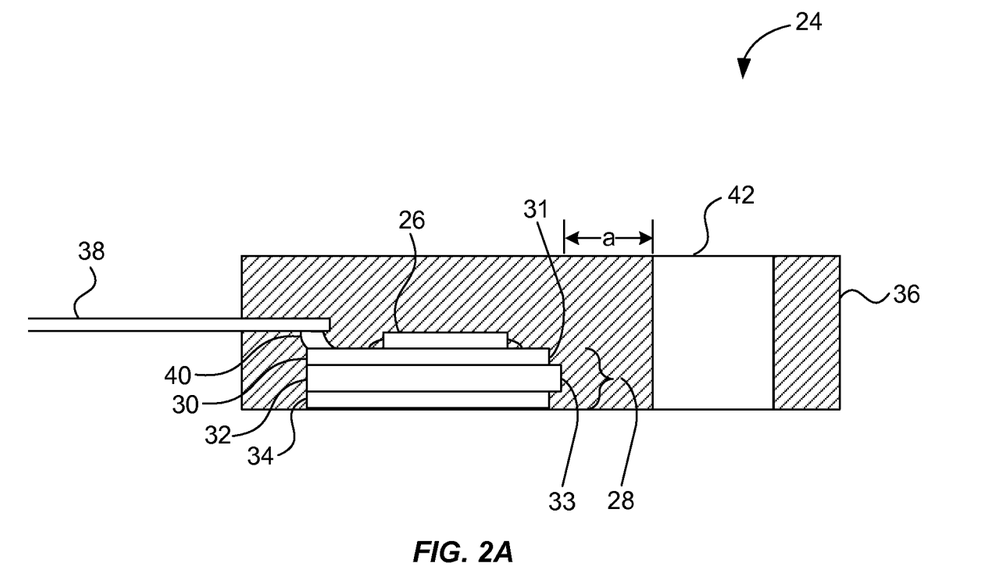
FIG. 2A is a simplified cross section of a power semiconductor die mounted on a DBC substrate arranged in an encapsulant defining a hole for receiving a structure for physically coupling the die to an object.

FIG. 2A shows a simplified cross section of a packaged power semiconductor device 24 according to one embodiment of the present invention. A power semiconductor die 26 is soldered to a direct bonded copper ("DBC", also known as direct copper bonded ("DCB")) substrate 28. The DBC substrate 28 includes a die-side (first) layer of copper 30, a layer of ceramic 32, and a back-side (second) layer of copper 34. A layer of encapsulant 36 is formed over the power semiconductor die 26, the DBC substrate 28, and device leads 38 (only one of which is shown). The device leads 38 may be used for electrically accessing the power semiconductor die 26, and may be electrically coupled to various portions of the packaged power semiconductor device. A center lead 38, as shown in the figure, includes a bent portion 40 and is soldered to the die-side copper layer 30. The bent portion 40 raises the other leads above the die-side copper layer 30. In one embodiment, the other leads are wire bonded or otherwise electrically coupled to the power semiconductor die 26, and the encapsulant 36 provides mechanical support for the leads. In another embodiment, the leads are soldered to the die-side copper layer 30.

The packaged power semiconductor device 24 may be adapted for a TO-247 outline; however, other embodiments may conform to other package outlines, such as the TO-220, TO-264, or SOT-227B outlines. An edge 31 of the die-side copper layer 30 that is located opposite an edge where the device leads 38 are coupled is set back from a corresponding edge 33 of the ceramic layer 32 so that the encapsulant 36 covers the edge of the die-side copper layer 31 and provides electrical isolation from the top and sides of the device 24. A bottom surface of the back-side copper layer 34 may also be exposed outside of the encapsulant 36.

The encapsulant 36 defines a hole 42. The hole 42 is defined through the entire encapsulant 36 from a top surface of the encapsulant 36 to a bottom surface of the encapsulant 36. The hole 42 may receive various structures for physically coupling or attaching the packaged power semiconductor device 24 to an object, such as a heat sink. The structures include, but are not limited to, screws, nails, and studs. The structures may be made from any solid material including, but not limited to, metal, plastic, and wood. The structures may be made from insulating or non-insulating material.

In one embodiment, the hole 42 has a diameter of approximately 3.5 mm. One skilled in the art will recognize that other diameter sizes are possible. The hole 42 is provided at a distance 'a' from an end of the DBC substrate 28. The distance 'a' should be sufficient to ensure that a structure provided in the hole 42 does not interfere with the operation of the power semiconductor die 26. In one embodiment, the distance 'a' is equal to approximately 1 mm. One skilled in the art will recognize that other distances are appropriate depending on at least the properties of the structure provided in the hole 42, the encapsulant 36, and the power semiconductor die 26.

Additional metal layers may be included. For example, one or both of the copper layers could be tinned or plated. The ceramic layer 32 is alumina ($Al_2O_3$) ceramic, but could be other material, such as aluminum nitride (AlN), beryllium oxide (BeO), silicon nitrite (SiN) or other insulating material compatible with DBC fabrication. Each layer of copper is about 0.30 mm thick, and the alumina layer is about 0.630 mm thick, making the DBC substrate about 1.23 mm thick overall. However, these thicknesses are given as examples only and thicker or thinner layers could be used and still remain within the scope of the invention.

Figure 2B:
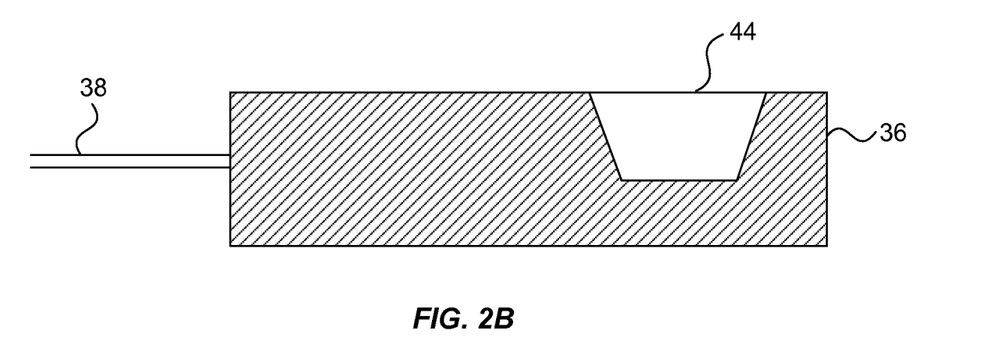
FIG. 2B is a simplified side view of a power semiconductor die mounted on a DBC substrate arranged in an encapsulant having notches.

FIG. 2B shows a simplified side view of the packaged power semiconductor device 24 illustrated in FIG. 2A. A notch 44 is provided in opposite sides of the encapsulant 36, where the opposite sides are perpendicular to a side receiving the leads 38. The notches 44 function to dissipate heat from the power semiconductor die 26 via the DBC substrate 28 and may also function to provide electrical connectivity with the power semiconductor die 26.

Figure 3A:
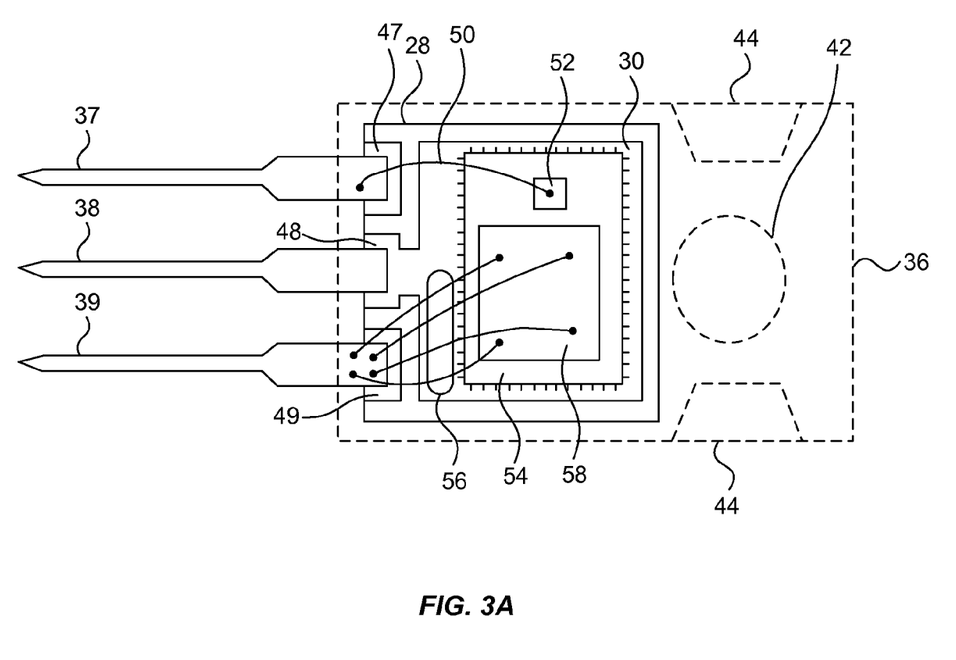
FIG. 3A is a simplified top view of a power semiconductor die attached to a DBC substrate arranged in an encapsulant defining a hole for receiving a structure for physically coupling the die to an object.

FIG. 3A is a simplified top view of the device shown in FIG. 2A and FIG. 2B with a top portion of the encapsulant 36 removed in accordance with one embodiment. Three device leads 37, 38, 39 are integrated with the DBC substrate 28. The die-side copper layer 30 is patterned to create lead connecting pads 47, 48, 49 that are electrically isolated from one another and that the leads are soldered to. One lead 37 is wire-bonded 50 to connect to one terminal 52 of a three-terminal device 54, such as the gate of an IGBT die. A second lead 39 is wire-bonded 56 to a second terminal 58 of the three-terminal device 54, such as the emitter of an IGBT die. The third lead 38 is soldered to the die-side copper layer 30, which is electrically coupled (by, e.g., soldering the three-terminal device 54 to the die-side copper layer 30) to a third terminal (such as a collector) of the three-terminal device 54. Other devices, such as a field-effect transistor (FET) which is also a three-terminal device, may also be used.

The three-terminal device 54 is arranged such that in a standard-sized package there is sufficient space in the encapsulant 36 for the encapsulant 36 to define a hole 42 without interfering with the operation of the three-terminal device 54. By arranging the three-terminal device 54 with sufficient space to define the hole 42, a size of the DBC substrate 28 is reduced. In one embodiment, a three-terminal device 54 having a pair of long edges and a pair of short edges (where the long edges are longer than the short edges) is arranged such that the long edges run parallel to the side of the packaged power semiconductor device 24 that receives the device leads 37, 38, and 39. In accordance with one embodiment, the DBC substrate 28 has a width of about 14 mm, a length of about 10 mm, and an overall thickness of about 1.23 mm.

Since the DBC substrate 28 is expensive, reducing the size of the DBC substrate 28 advantageously reduces the manufacturing costs of the packaged power semiconductor device 24. Moreover, reducing the size of the DBC substrate 28 advantageously facilitates the use of standardized packages defining holes for receiving structures such as a screw for physically coupling or attaching the packaged power semiconductor device 24 to an object such as a heat sink. Accordingly, a packaged power semiconductor device 24 having both superior electrical isolation characteristics and standardized mounting mechanisms may be provided.

Figure 3B:
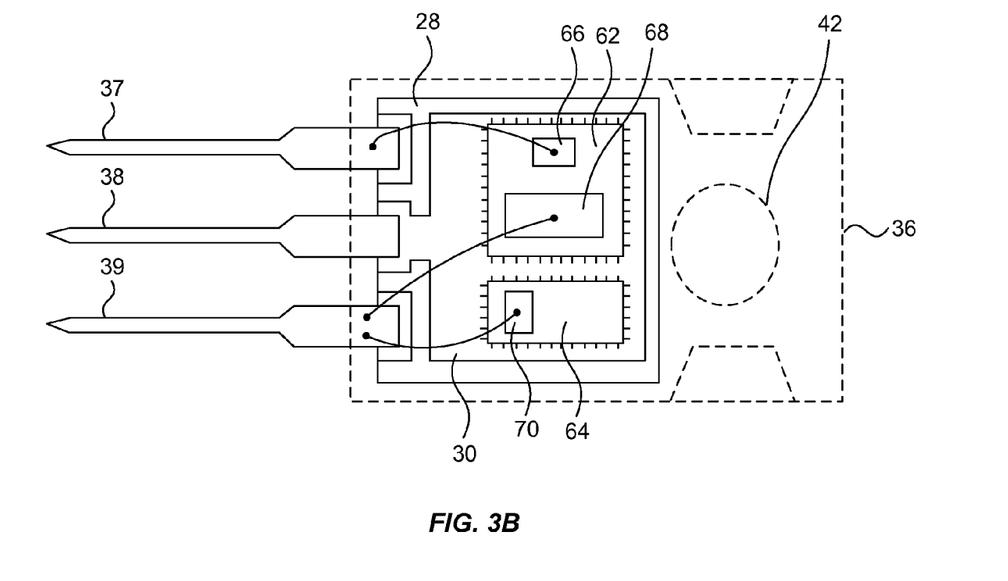
FIG. 3B is a simplified top view of a plurality of power semiconductor dice provided in a first arrangement attached to a DBC substrate arranged in an encapsulant defining a hole for receiving a structure for physically coupling the die to an object.

FIG. 3B is a simplified top view of the device shown in FIG. 2A and FIG. 2B with a top portion of the encapsulant layer removed in accordance with another embodiment. The features of this embodiment are similar to those of the embodiment illustrated in FIG. 3A with the following exceptions. A three-terminal device 62 and a two-terminal device 64 are integrated with the DBC substrate 28. One lead 37 is wire-bonded to connect to one terminal 66 of the three-terminal device 62. A second lead 39 is wire-bonded to connect to one terminal 68 of the three-terminal device 62 and one terminal 70 of the two-terminal device 64. The third lead 38 is soldered to the die-side copper layer 30, which is electrically coupled (by, e.g., soldering the three-terminal device 62 and the two-terminal device 64 to the die-side copper layer 30) to a third terminal of the three-terminal device 62 and a second terminal of the two-terminal device 64. The three-terminal device 62 may be a FET, IGBT, SCR, or other three-terminal device as known in the art. Similarly, the two-terminal device 64 may be a diode (avalanche, rectifier, Gunn, Zener, etc.) or other two-terminal device as known in the art.

The three-terminal device 62 and two-terminal device 64 are arranged such that in a standard-sized package there is sufficient space in the encapsulant 36 for the encapsulant 36 to define a hole 42 without interfering with the operation of either the three-terminal device 62 or the two terminal device 64. By arranging the three-terminal device 62 and two-terminal device 64 to provide sufficient space or the hole 42, a size of the DBC substrate 28 is reduced while simultaneously increasing the processing capabilities of the packaged power semiconductor device 24. In one embodiment, a three-terminal device 62 having a pair of long edges and a pair of short edges (where the long edges are longer than the short edges) is arranged such that the long edges run parallel to the side of the packaged power semiconductor device 24 that receives the device leads 37, 38, and 39. A two-terminal device 64 having a pair of long edges and a pair of short edges (where the long edges are longer than the short edges) is arranged such that the short edges run parallel to the side of the packaged power semiconductor device 24 that receives the device leads 37, 38, and 39.

Since the DBC substrate is expensive, reducing the size of the DBC substrate 28 advantageously reduces the manufacturing costs of the packaged power semiconductor device 24. Reducing the size of the substrate advantageously facilitates the use of standardized packages defining holes for receiving structures such as a screw for physically coupling or attaching the packaged power semiconductor device 24 to an object such as a heat sink. Moreover, providing multiple devices (such as a three-terminal device and a two-terminal device) on the reduced DBC substrate 28 advantageously increases the processing capabilities of the packaged power semiconductor device 24. Accordingly, a packaged power semiconductor device 24 having superior electrical isolation characteristics, standardized mounting mechanisms, and increased processing capabilities may be provided.

Figure 3C:
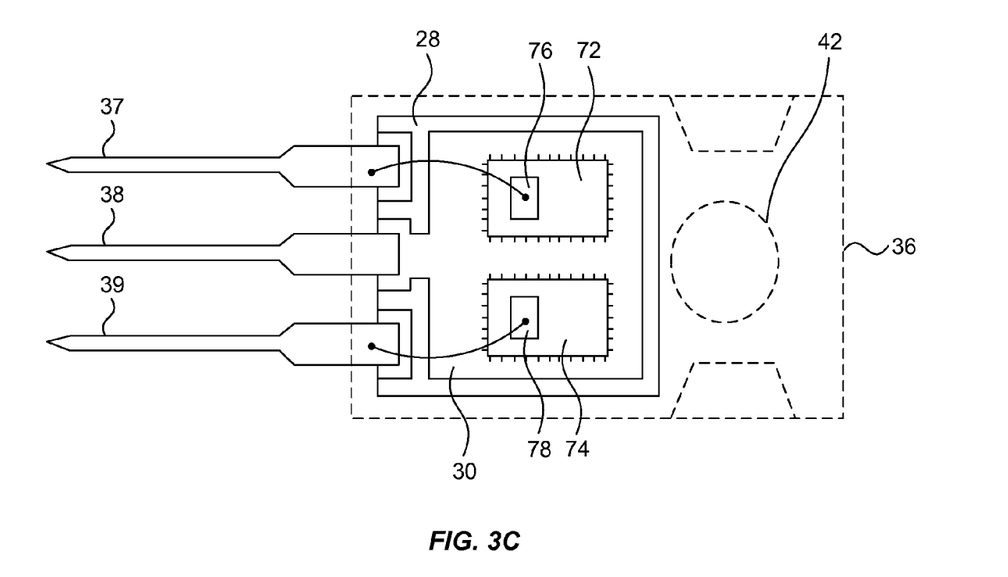
FIG. 3C is a simplified top view of a plurality of power semiconductor dice provided in a second arrangement and attached to a DBC substrate that is arranged in an encapsulant defining a hole for receiving a structure for physically coupling the dice to an object.

FIG. 3C is a simplified top view of the device shown in FIG. 2A and FIG. 2B with a top portion of the encapsulant layer removed in accordance with another embodiment. The features of this embodiment are similar to those of the embodiment illustrated in FIG. 3A with the following exceptions. A first two-terminal device 72 and a second two-terminal device 74 are integrated with the DBC substrate 28. One lead 37 is wire-bonded to connect to one terminal 76 of the first two-terminal device 72. A second lead 39 is wire-bonded to connect to one terminal 78 of the second two-terminal device 74. The third lead 38 is soldered to the die-side copper layer 30, which is electrically coupled (by, e.g., soldering the first two-terminal device 72 and the second two-terminal device 74 to the die-side copper layer 30) to a second terminal of the first two-terminal device 72 and a second terminal of the second two-terminal device 74. The first two-terminal device 72 and the second two-terminal device 74 may be the same or different from one another, and they may be a diode (avalanche, rectifier, Gunn, Zener, etc.) or other two-terminal device as known in the art.

The first two-terminal device 72 and the second two-terminal device 74 are arranged such that in a standard-sized package there is sufficient space in the encapsulant 36 for the encapsulant 36 to define a hole 42 without interfering with the operation of either the first two-terminal device 72 or the second two-terminal device 74. By arranging the first two-terminal device 72 and the second two-terminal device 74 to provide sufficient space for the hole 42, a size of the DBC substrate 28 is reduced while simultaneously increasing the processing capabilities of the packaged power semiconductor device 24. In one embodiment, the first two-terminal device 72 and the second two-terminal device 74 are substantially square in shape and arranged beside one another. In another embodiment, the first two-terminal device 72 and the second two-terminal device 74 are substantially rectangular in shape and arranged beside one another. In other embodiments, the first two-terminal device 72 and the second two-terminal device 74 are other shapes.

Figure 3D:
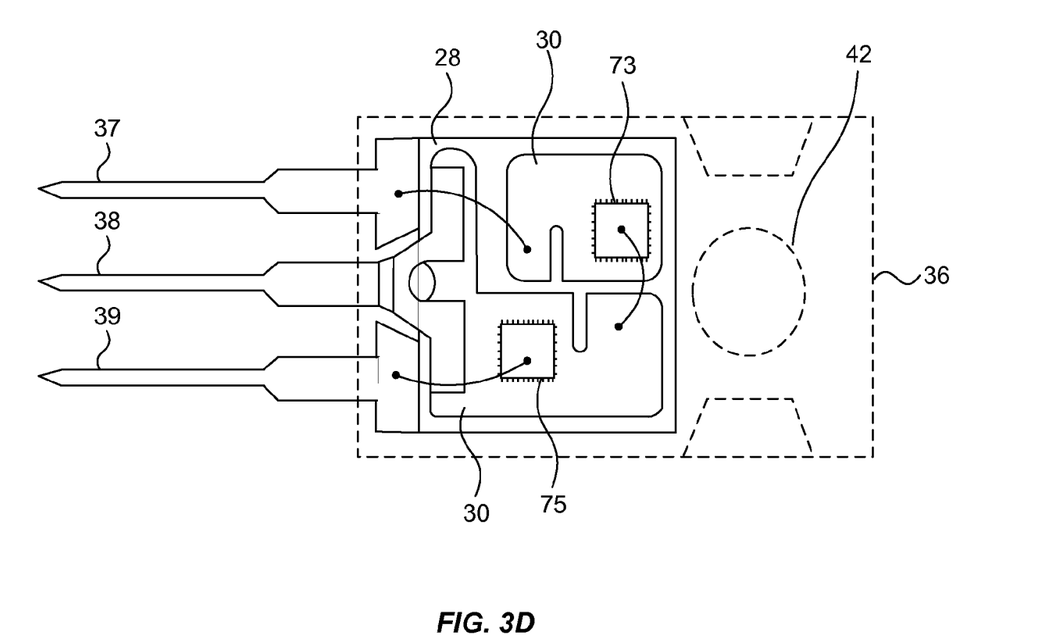
FIG. 3D is a simplified top view of a plurality of power semiconductor dice provided in a third arrangement and attached to a DBC substrate that is arranged in an encapsulant defining a hole for receiving a structure for physically coupling the dice to an object, where the DBC substrate has a certain structure on the die side to design a pattern which can be used as a circuit.

FIG. 3D is a simplified top view of the device shown in FIG. 2A and FIG. 2B with a top portion of the encapsulant layer removed in accordance with another embodiment. The features of this embodiment are similar to those of the embodiment illustrated in FIG. 3A with the following exceptions. A first two-terminal device 73 and a second two-terminal device 75 are integrated with the DBC substrate 28. A terminal of the first two-terminal device 73 is electrically coupled (e.g., by soldering) to a first portion of the die-side copper layer 30, and a terminal of the second two-terminal device 75 is electrically coupled (e.g., by soldering) to a second portion of the copper layer 30. The die-side copper layer 30 is patterned so that the first portion of the die-side copper layer 30 is electrically isolated from the second portion of the die-side copper layer 30.

One lead 37 is wire-bonded to connect to the first portion of the die-side copper layer 30. A second lead 39 is wire-bonded to connect to a terminal of the second two-terminal device 75. The third lead 38 is soldered to the second portion of the die-side copper layer 30. The first two-terminal device 73 is wire-bonded to connect to the second portion of the die-side copper layer 30.

The first two-terminal device 73 and the second two-terminal device 75 may be the same or different from one another, and they may be a diode (e.g., avalanche, rectifier, Gunn, Zener, etc.) or other two-terminal device as known in the art.

The die-side copper layer 30 is patterned and the first two-terminal device 73 and the second two-terminal device 75 are arranged such that in a standard-sized package there is sufficient space in the encapsulant 36 for the encapsulant 36 to define a hole 42 without interfering with the operation of either the first two-terminal device 73 or the second two-terminal device 75. By patterning the die-side copper layer 30 and arranging the first two-terminal device 73 and the second two-terminal device 75 to provide sufficient space for the hole 42, a size of the DBC substrate 28 is reduced while simultaneously increasing the processing capabilities of the packaged power semiconductor device 24. In one embodiment, the first two-terminal device 73 and the second two-terminal device 75 are substantially square in shape and arranged beside one another. In another embodiment, the first two-terminal device 73 and the second two-terminal device 75 are substantially rectangular in shape and arranged beside one another. In other embodiments the first two-terminal device 73 and the second two-terminal device 75 are other shapes.

Since the DBC substrate is expensive, reducing the size of the DBC substrate 28 advantageously reduces the manufacturing costs of the packaged power semiconductor device 24. Reducing the size of the substrate advantageously facilitates the use of standardized packages defining holes for receiving structures such as a screw for physically coupling or attaching the packaged power semiconductor device 24 to an object such as a heat sink. Moreover, providing multiple devices (such as multiple two-terminal devices) on the reduced DBC substrate 28 advantageously increases the processing capabilities of the packaged power semiconductor device 24. Accordingly, a packaged power semiconductor device 24 having superior electrical isolation characteristics, standardized mounting mechanisms, and increased processing capabilities may be provided.

While the embodiments illustrated in FIG. 3A, FIG. 3B, and FIG. 3C show the implementation of particular two- and three-terminal devices, the invention is not so limited. Variations on these embodiments are also within the scope of the present invention. For example, multiple three-terminal devices may be used; three or more two-terminal devices may be used; or various combinations of two- and three-terminal devices may be used. One or more wires may be used to wirebond leads to terminals. Some, all, or none of the leads may be soldered to the die-side copper layer 30.

Figure 4:
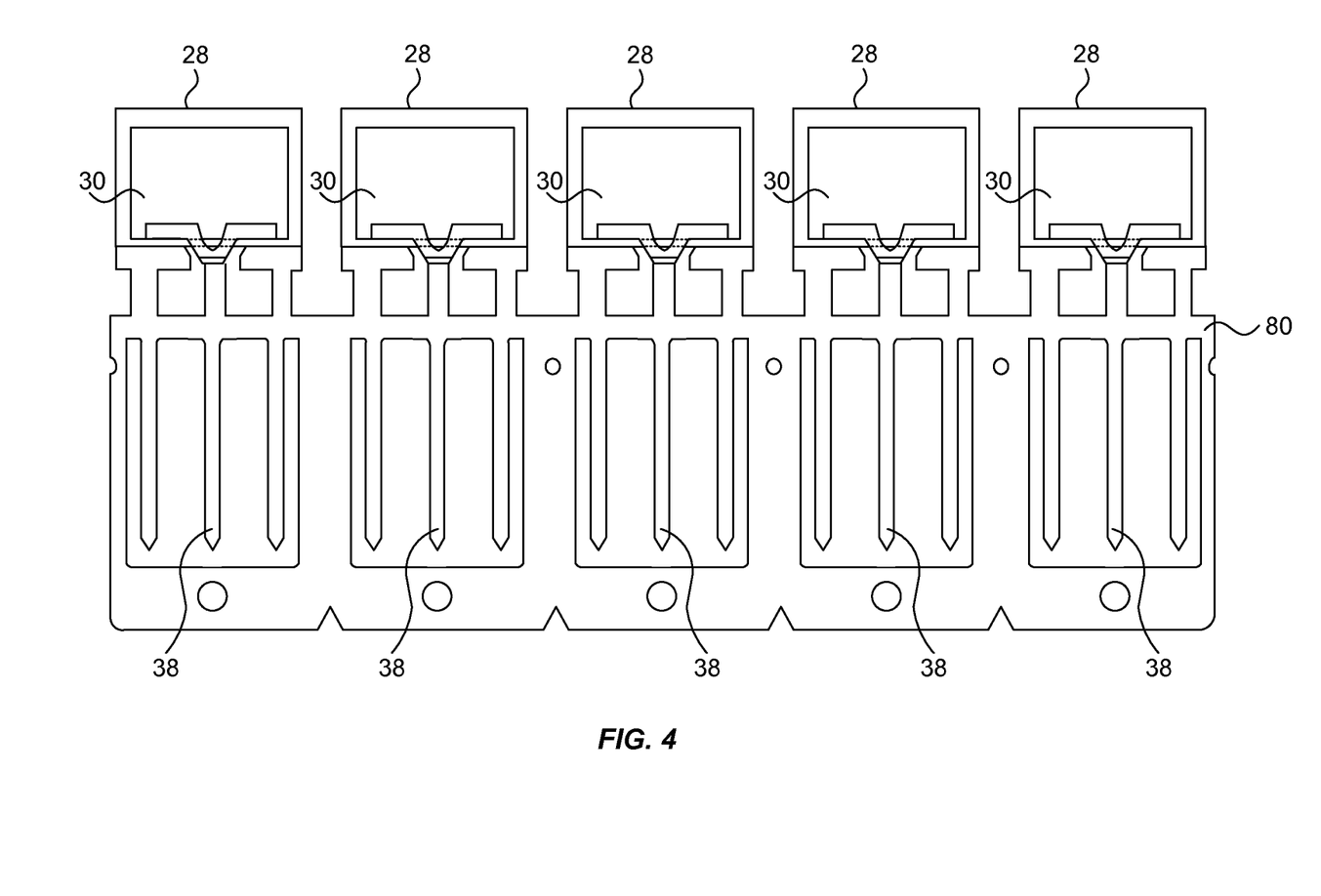
FIG. 4 is a simplified top view of a copper lead frame attached to a plurality of DBC substrates for being arranged in an encapsulant defining a hole for receiving a structure for physically coupling the die to an object.

FIG. 4 is a simplified top view of a lead frame with DBC substrates 28 attached. The copper lead frame 80 is made from alloy 194, TAMAC-4, or equivalents, and is approximately 0.6 mm thick. The width of the DBC substrate 28 is about 14 mm and the length of the DBC substrate 28 is about 10 mm. As discussed above, the thickness of the DBC substrate 28 is about 1.23 mm. The center leads 38 are soldered to the die-side copper layer 30 of the DBC substrates. After die attachment and wire bonding, five unencapsulated devices are cut from the lead frame using a trimming tool or other means, as is known in the art.

A molding press is loaded with unencapsulated devices and a plastic encapsulant is heated and formed around the device in accordance with an appropriate package specification, if any. For example, the plastic encapsulant may be formed to define a hole for receiving a structure for physically coupling the device to an object such as a heat sink. The yield through the encapsulation process is higher for DBC packaged devices than if similar devices with bare ceramic substrates are encapsulated. Using a DBC substrate reduces cracking of both the substrate and the semiconductor die. Cracking of the substrate is reduced because the composite DBC structure provides support for the ceramic layer. Cracking of the semiconductor die is also reduced because the thermal expansion coefficient of DBC more closely matches that of silicon than does the thermal expansion coefficient of typical ceramics. Efficiently placing one or more dice on the substrate facilitates the use of less substrate, thus reducing manufacturing costs.

Furthermore, using a bare ceramic substrate for a packaged power semiconductor device typically increases costs and reduces thermal performance compared to a DBC packaged power semiconductor device according to the present invention. First, in order to attach the die to a ceramic substrate, a die attach pad is usually provided. This is often done by silk-screening a metal-glass frit onto the ceramic substrate and firing the frit. The metal in the frit is usually an expensive noble metal, and the screening and firing process results in additional yield loss. Second, the thermal performance of a package with a bare ceramic substrate is inferior to the DBC package.

The die-side copper layer of the DBC package serves as a heat-spreading layer to increase the heat-transfer area from the "footprint" of the semiconductor die to nearly the entire DBC substrate area, i.e., the area of the die-side copper layer. For a given thickness of ceramic, which typically has higher thermal resistance than copper, a larger heat-transfer area will provide superior heat transfer across the high-resistance layer, as those skilled in the art will appreciate.

The back-side copper layer also improves the thermal performance of the DBC package in a number of ways. Although the die-side copper layer spreads the heat from the die, the temperature in the vicinity of the die ("underneath" the die) is higher than the temperature at the edge of the die-side copper layer. The extent of this heat gradient depends on many factors; however, the back-side copper layer serves to spread the heat transferred across the ceramic layer and reduce the formation of a hot-spot underneath the die. Heat spreading from both copper layers also reduces heat-related stress and resultant cracking of the substrate and/or die, thus improving reliability.

Additionally, the direct-bonding process intimately attaches the copper to the ceramic, providing for excellent thermal conduction from one layer to the next. This thermal conduction is better than typically occurs when contacting a bare ceramic substrate against a heatsink. The high thermal resistance of the ceramic impedes lateral heat spreading, so that each microscopic contact point with the heatsink becomes a hot-spot. The heat-conductivity of the back-side copper layer provides good lateral heat conduction, reducing the consequences of localized contact with the heatsink. Finally, the back-side copper layer allows the DBC packaged device to be coupled to a heatsink, thermally coupling the entire area of the back-side layer to the heatsink.

Even if the back side of a ceramic substrate were coated with frit and fired, the thermal performance would not equal that of the DBC packaged device, as the metal-glass matrix of the fired frit does not conduct heat as well at the copper layer of the DBC packaged device. Therefore, the DBC packaged power device can thermally couple to a heatsink while providing electrical isolation. Moreover, the DBC packaged power device exhibits these advantageous characteristics while exploiting industry standard package configurations and increasing the processing capabilities of the device.

An assembly procedure similar to that disclosed in U.S. Pat. No. 6,404,065, U.S. Pat. No. 6,534,343, and U.S. Pat. No. 6,583,505, all of which are assigned to Ixys Corp. of Milpitas, CA, and all of which are incorporated by reference herein in their entirety, may be used to assemble the packaged power semiconductor device 24.

Figure 5A:
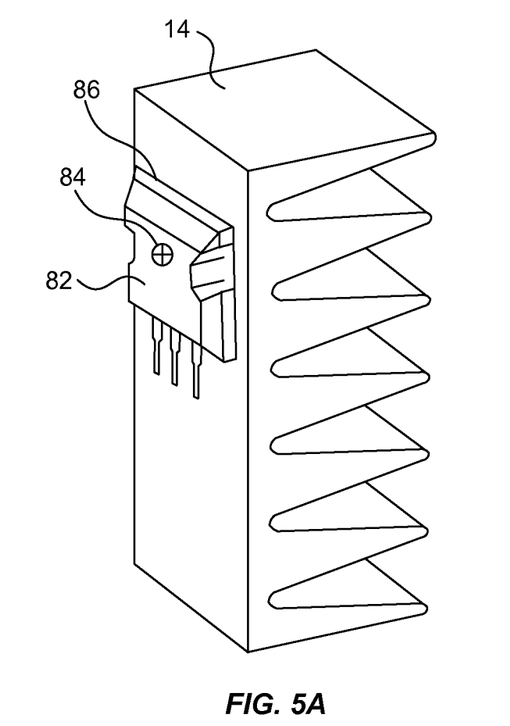
FIG. 5A is a simplified view of a power semiconductor device attached to a heatsink using a screw.

FIG. 5A is a simplified view of a DBC packaged power semiconductor device 82 mechanically coupled to a heatsink 14. In this embodiment, a screw 84 is provided for mechanically coupling the power semiconductor device 82 to the heatsink 14. The screw may be made from any solid material including, but not limited to, metal, plastic, and wood. The screw may be made from insulating or non-insulating material. Material 86 (such as epoxy) may additionally be used for physically coupling the heatsink 14 to the screw 84 and/or additional material 86 may be used for increasing the heat conductivity between the power semiconductor device 82 and heatsink 14.

Figure 5B:
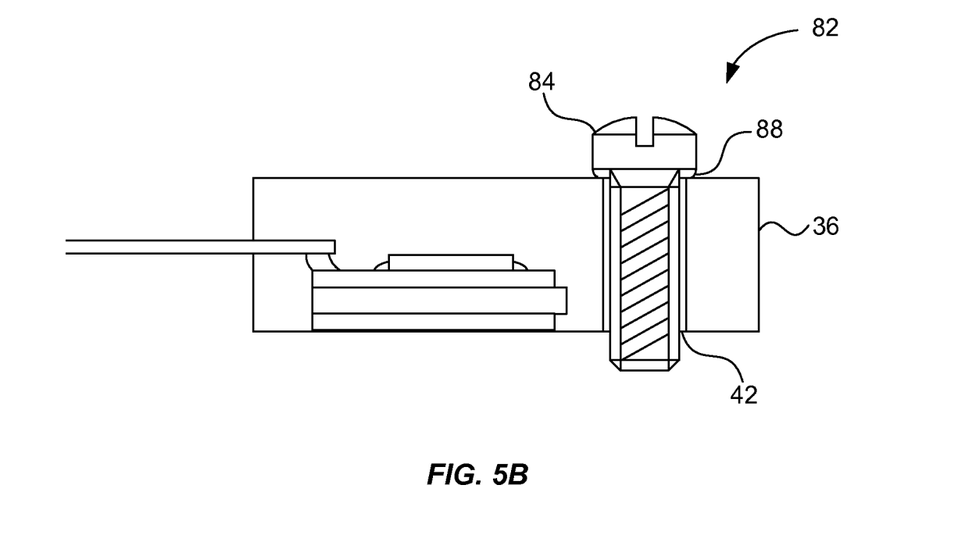
FIG. 5B is a simplified view of a power semiconductor device arranged in an encapsulant where a screw is provided therein for physically coupling the device to an object.

FIG. 5B is a simplified side view of a DBC power semiconductor device 82 wherein a screw 84 is provided as a structure for mechanically coupling the power semiconductor device 82 to an object such as a heatsink 14. A washer 88 may be provided between a top surface of the encapsulant 36 and a bottom surface of a head of the screw 84. The washer 88 may be made from any solid material including, but not limited to, metal, plastic, and wood. The screw may be made from insulating or non-insulating material. The screw 84 should have a diameter so as to mechanically couple to the hole 42 defined by the encapsulant 36. The screw 84 should have a length sufficient to penetrate the object (such as the heatsink) so as to securely fasten the power semiconductor device 82 to the object.

Figure 6A:
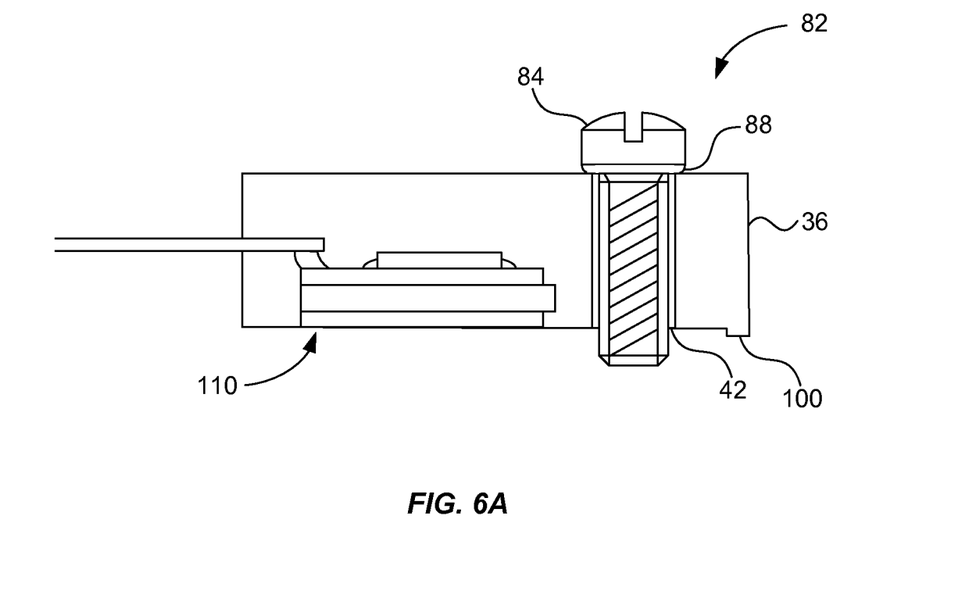
FIG. 6A is a simplified view of a power semiconductor device with a bottom surface, which is not flat, but has a protrusion behind the screw hole opposite the lead frame side.

FIG. 6A is a simplified side view of a DBC power semiconductor device 82 wherein a screw 84 is provided as a structure for mechanically coupling the power semiconductor device 82 to an object such as a heatsink 14. A washer 88 may be provided between a top surface of the encapsulant 36 and a bottom surface of a head of the screw 84. The washer 88 may be made from any solid material including, but not limited to, metal, plastic, and wood. The screw may be made from insulating or non-insulating material. The screw 84 should have a diameter so as to mechanically couple to the hole 42 defined by the encapsulant 36. The screw 84 should have a length sufficient to penetrate the object (such as the heatsink) so as to securely fasten the power semiconductor device 82 to the object. In accordance with this embodiment, a bottom side 110 of the semiconductor device 82 is not flat. The semiconductor device 82 has a protrusion 100 on the bottom side 110, which is the heatsink 14 side. The protrusion 100 is located behind the hole 42 opposite the leadframe side. In other words, the protrusion 100 is located on a side of the hole 42 which is opposite a side of the hole 42 which the DBC substrate 28 is located. From a side view of the semiconductor device 82 the protrusion is shaped like a heel. However, this shape is given as an example only and other shapes could be used. In one embodiment, the protrusion 100 is a part of the encapsulant 36. In another embodiment, the protrusion 100 is not a part of the encapsulant 36 but rather is formed of material physically coupled to the encapsulant 36. The material may be any rigid material and may be physically coupled to the encapsulant 36 as known in the art.

Figure 6B:
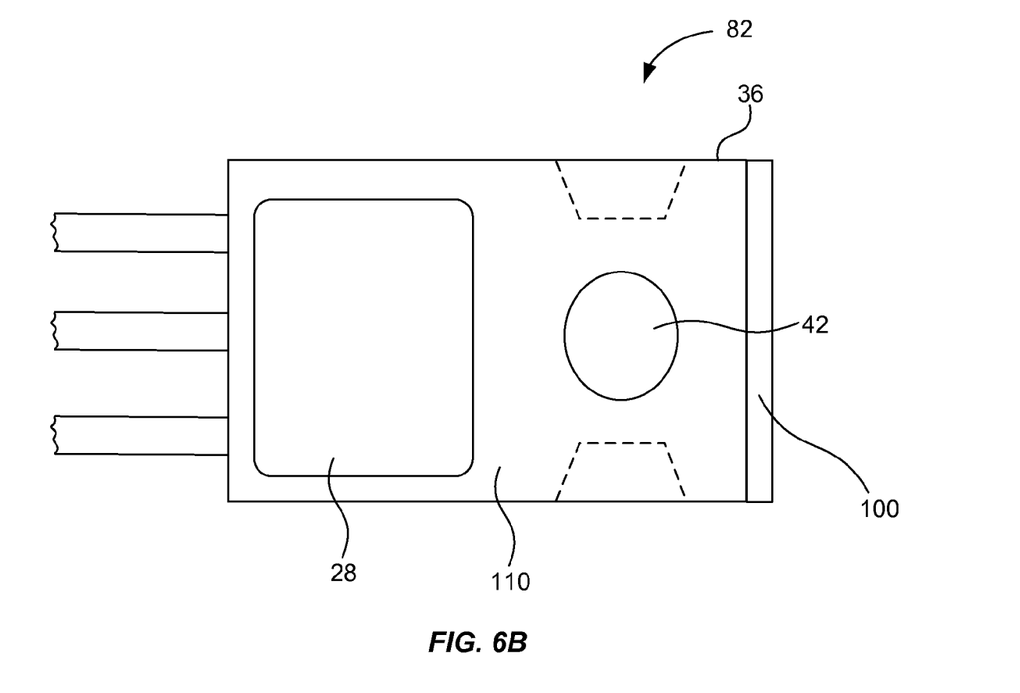
FIG. 6B is simplified bottom view of a power semiconductor device with a bottom surface, which is not flat, but has a protrusion behind the screw hole opposite the lead frame side.

FIG. 6B is a simplified bottom view of a DBC power semiconductor device 82 wherein an encapsulant 36 defines a hole 42 for receiving a structure (such as a screw) that mechanically couples the power semiconductor device 82 to an object. A DBC substrate 28 is provided as an insulating structure for mechanically coupling the power semiconductor device 82 to an object such as a heatsink 14 and for thermal coupling the power semiconductor device 82 to the heatsink 14. In accordance with this embodiment, a bottom side 110 of the semiconductor device 82 is not flat. The semiconductor device 82 has a protrusion 100 on the bottom side 110, which is the heatsink 14 side. The protrusion 100 is located behind the hole 42 opposite the leadframe side. The protrusion 100 has substantially a rectangular shape. However, this shape is given as an example only and other shapes could be used. The protrusion 100 is substantially continuous and extends substantially across a width of the power semiconductor device 82. In one embodiment, the protrusion 100 is a part of the encapsulant 36. In another embodiment, the protrusion 100 is not a part of the encapsulant 36 but rather is formed of material physically coupled to the encapsulant 36. The material may be any rigid material and may be physically coupled to the encapsulant 36 as known in the art.

Figure 6C:
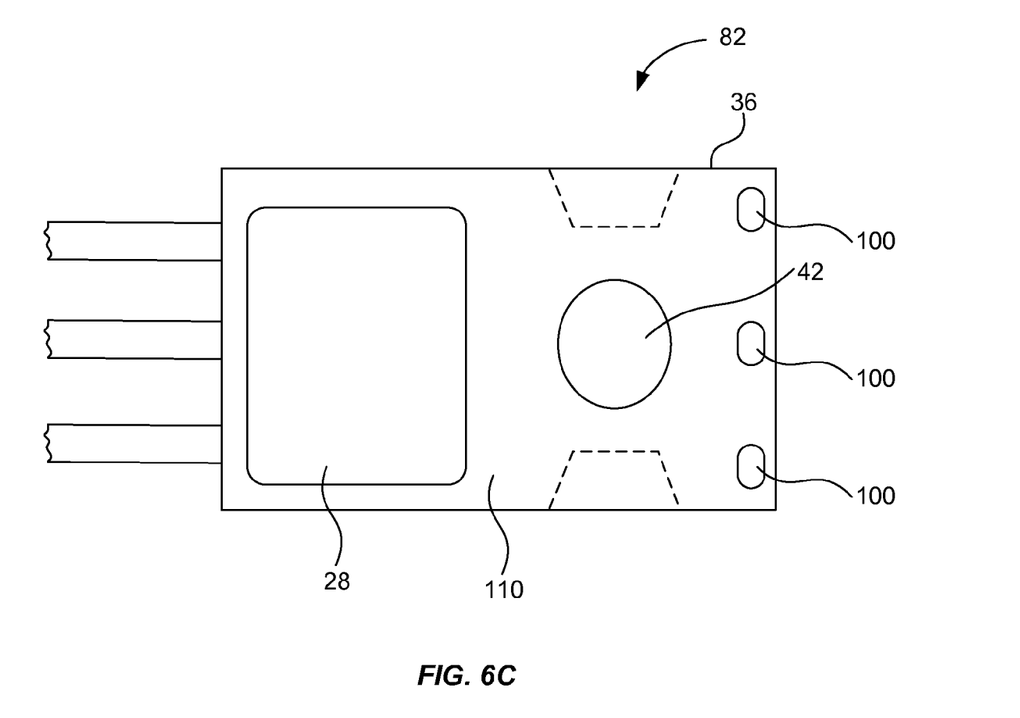
FIG. 6C is simplified bottom view of a power semiconductor device with a bottom surface, which is not flat, but has one or more protrusions behind the screw hole opposite the lead frame side.

FIG. 6C is a simplified bottom view of a DBC power semiconductor device 82 wherein an encapsulant 36 defines a hole 42 for receiving a structure (such as a screw) that mechanically couples the power semiconductor device 82 to an object. A DBC substrate 28 is provided as an insulating structure for mechanically coupling the power semiconductor device 82 to an object such as a heatsink 14 and for thermal coupling the power semiconductor device 82 to the heatsink 14. In accordance with this embodiment, a bottom side 110 of the semiconductor device 82 is not flat. The semiconductor device 82 has two or more protrusions 100 on the bottom side 110, which is the heatsink 14 side. The protrusions 100 are located behind the hole 42 opposite the leadframe side, and are substantially discontinuous with one another. The two or more protrusions are substantially cylindrical in shape. However, this shape is given as an example only and other shapes could be used. The two or more protrusions may be all have the same shape or they may have different shapes. In one embodiment, the two or more protrusions 100 are a part of the encapsulant 36. In another embodiment, the two or more protrusions 100 are not a part of the encapsulant 36 but rather are formed of material physically coupled to the encapsulant 36. The material may be any rigid material and may be physically coupled to the encapsulant 36 as known in the art. In another embodiment, some of the two or more protrusions 100 are part of the encapsulant 36 and some of the two or more protrusions 100 are formed of material physically coupled to the encapsulant 36.

Figure 7A:
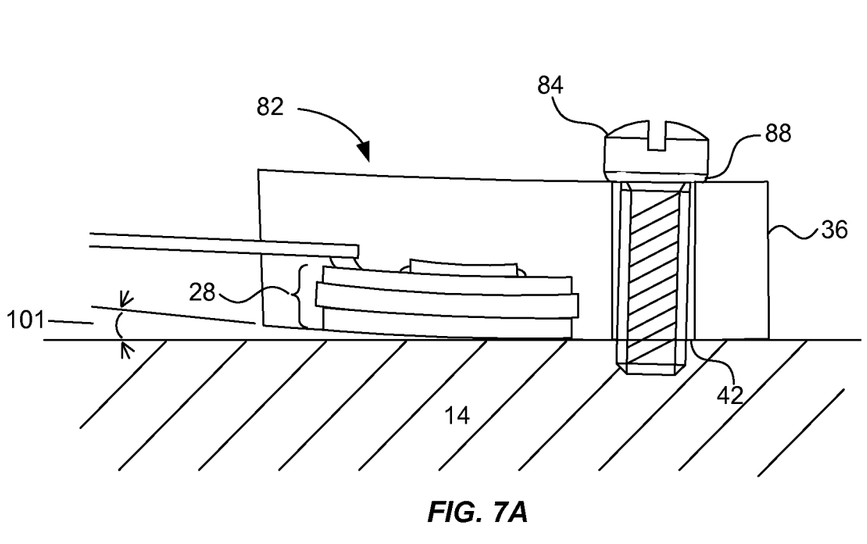
FIG. 7A is simplified side view of a power semiconductor device, which is mounted on a heatsink, and which does not include a protrusion.

FIG. 7A is a simplified side view of a DBC power semiconductor device 82 wherein a screw 84 is provided as a structure for mechanically coupling the power semiconductor device 82 to an object such as a heatsink 14. A washer 88 may be provided between a top surface of the encapsulant 36 and a bottom surface of a head of the screw 84. The washer 88 may be made from any solid material including, but not limited to, metal, plastic, and wood. The screw may be made from insulating or non-insulating material. The screw 84 has a diameter so as to mechanically couple to the hole 42 defined by the encapsulant 36. The screw 84 also has a length sufficient to penetrate the object (such as the heatsink 14) so as to securely fasten the power semiconductor device 82 to the object. As a result of the screw 84 engaging with the hole 42, the power semiconductor 82 device is asymmetrically pressed against the heatsink 14. This asymmetric mounting onto the heatsink 14 can create a reduced contact between the power semiconductor device 82 and the heatsink 14 at an area underneath the DBC substrate 28 compared to an area of the power semiconductor device 82 around the screw 84. Depending on the transfer mold material and the substrate material used, the bottom side of the power semiconductor device 82 can also have a convex shape. Either or both of the screw 84 engaging with the hole 42, and the transfer mold and substrate material used can cause a thin gap 101 between the power semiconductor device 82 and the heatsink 14. The gap 101 is located at an end of the power semiconductor device 82 opposite a location of the screw 84. In the case of a gap 101, the thermal contact between the DBC substrate 28 and the heatsink 14 is not optimized.

Figure 7B:
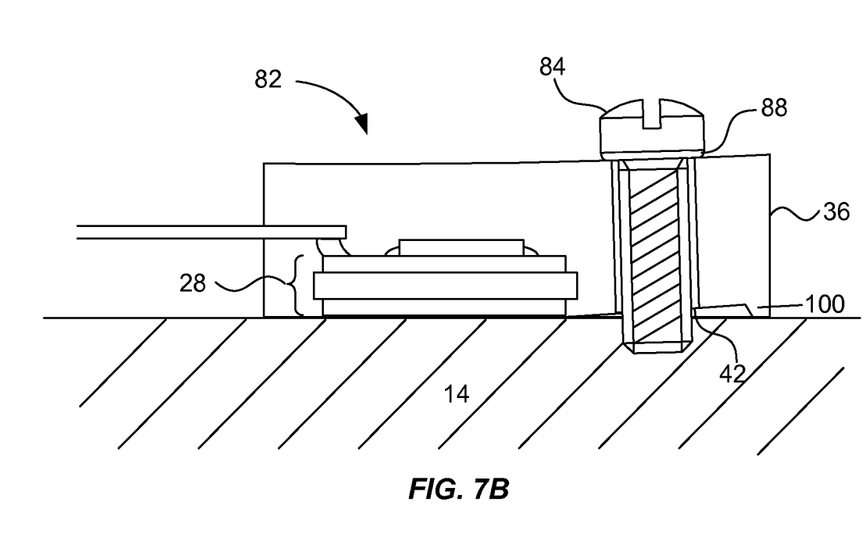
FIG. 7B is simplified side view of a power semiconductor device, which is mounted on a heatsink, and which includes a protrusion.

FIG. 7B is a simplified side view of a DBC power semiconductor device 82 wherein a screw 84 is provided as a structure for mechanically coupling the power semiconductor device 82 to an object such as a heatsink 14. A washer 88 may be provided between a top surface of the encapsulant 36 and a bottom surface of a head of the screw 84. The washer 88 may be made from any solid material including, but not limited to, metal, plastic, and wood. The screw 84 may be made from insulating or non-insulating material. The screw 84 has a diameter so as to mechanically couple to the hole 42 defined by the encapsulant 36. The screw 84 also has a length sufficient to penetrate the object (such as the heatsink 14) so as to securely fasten the power semiconductor device 82 to the object. As a result of mounting the power semiconductor device 82 onto the heatsink 14 using a screw 84, the power semiconductor device 82 is asymmetrically pressed against the heatsink 14. This assymetric mounting onto the heatsink 14 can create a reduced contact between the power semiconductor device 82 and the heastink 14 at an area underneath the DBC substrate 28 compared to an area of the power semiconductor device 82 around the screw 84. Depending on the transfer mold material and the substrate material used, the bottom side of the power semiconductor device 82 can also have a convex shape. The existence of one or two or more protrusions 100 located opposite the leadframe side improves mechanical and thermal contact between the DBC substrate 28 and the heatsink 14. This close mechanical and thermal contact between the DBC substrate 28 and the heatsink 14 results in an excellent thermal coupling between the power semiconductor device 82 and the heatsink 14.

Figure 7C:
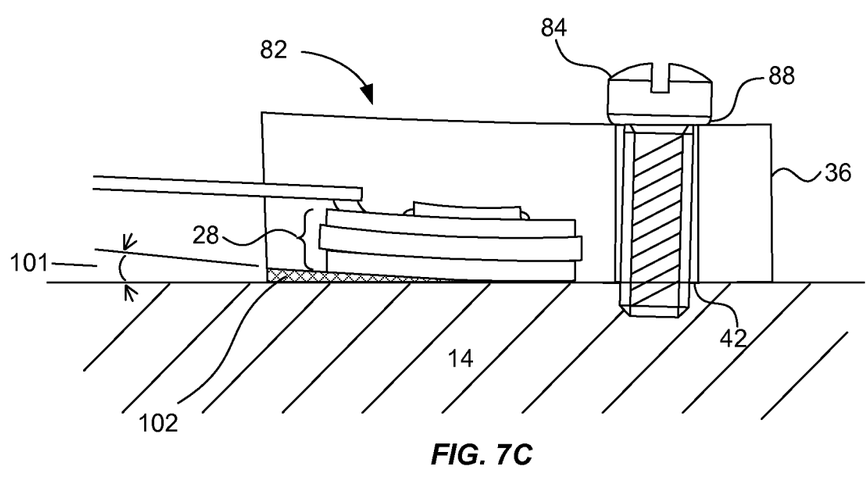
FIG. 7C is simplified side view of a power semiconductor device, which is mounted on a heatsink, which does not include a protrusion, and which includes a thermally conductive material.

FIG. 7C is a simplified side view of a DBC power semiconductor device 82. The features of this embodiment are similar to those of the embodiment illustrated in FIG. 7A with the following exceptions. A thermally conductive material 102 such as thermal grease or phase change material is provided for further increasing heat transfer between the DBC substrate 28 and the heatsink 14. The thermally conductive material 102 may be predispensed to fully or partially fill the gap 101. The thermally conductive material 102 may be predispensed between all or portions of a bottom surface of the power semiconductor device 82 and a top surface of the heatsink 14. The thermally conductive material 102 may also be predispensed between all or portions of a bottom surface of the DBC substrate 28 and a top surface of the heatsink 14. In another embodiment, where a protrusion 100 of the encapsulant 36 is provided, such as that illustrated in FIG. 7B, a thermally conductive material 102 may be provided between all or portions of a bottom surface of the power semiconductor device 82 and a top surface of the heatsink 14 and/or between all or portions of a bottom surface of the DBC substrate 28 and a top surface of the heatsink 14.

While the invention has been particularly shown and described with reference to a specific embodiment thereof, it will be understood by those skilled in the art that the foregoing and other changes in the form and details may be made therein without departing from the spirit or scope of the invention. For example, the DBC substrate 28 may be a direct aluminum bonded (DAB) substrate where a layer of aluminum is provided instead of a die-side layer of copper 30 and a layer of aluminum is provided instead of a back-side layer of copper 34. In other embodiments, a conductive metal is provided instead of a die-side layer of copper 30 and instead of a back-side layer of copper 34, and a dielectric layer is provided instead of a layer of ceramic 32. For another example, while a TO-247 package was used to illustrate the present invention, other package types, both standard and non-standard, could be applied to the present invention. These and other equivalents and alternatives are intended to be included within the scope of the present invention. Therefore, the scope of this invention should not be limited to the embodiments described above, and should instead be defined by the following claims.

What is claimed is:

1. A packaged power semiconductor device comprising:
   a ceramic substrate having an upper and lower surface on opposite sides thereof;
   an upper electrically conductive layer bonded to the upper surface of the ceramic substrate;
   a lower electrically conductive layer bonded to the lower surface of the ceramic substrate;
   a plurality of electrically conductive leads attached along an edge of the upper electrically conductive layer;
   a generally rectangular power semiconductor device having a pair of longer sides and a pair of shorter sides, the generally rectangular power semiconductor device being attached to the upper electrically conductive layer in an orientation with the longer sides being parallel to the edge of the upper electrically conductive layer to which the plurality of electrically conductive leads are attached;
   a region of encapsulating material disposed to cover the semiconductor device, the ceramic substrate and the upper electrically conductive layer, the encapsulant not covering a major surface of the lower electrically conductive layer, and leaving at least a portion of each of the plurality of electrically conductive leads exposed and extending from the encapsulant;
   the encapsulating material extending away from the plurality of electrically conductive leads in a direction parallel to the edge of the upper electrically conductive layer to thereby provide an extended region of encapsulant having an upper surface, a lower surface, an end surface opposite the edge of the upper electrically conductive layer, and side surfaces;
   a hole extending through the extended region of encapsulant from the upper surface to the lower surface of the extended region of encapsulant thereof to enable attachment of the packaged power semiconductor device to a mount; and
   a first notch in the extended region of the encapsulant, the first notch extending into the encapsulant from the upper surface of the extended region of encapsulant and one of the side surfaces toward the hole, and extending toward the ceramic substrate.

2. The packaged power semiconductor device as in claim 1 further comprising a protrusion on the lower surface of the extended region of encapsulant at the end surface.

3. The packaged power semiconductor device as in claim 2 wherein the protrusion extends across the lower surface of the encapsulant at the end surface.

4. The packaged power semiconductor device as in claim 3 wherein the protrusion comprises a series of separated regions extending from the lower surface of the encapsulant.

5. The packaged power semiconductor device as in claim 1 further comprising a second notch extending into the encapsulant from the upper surface of the extended region encapsulant and another of the side surfaces toward the hole, and extending toward the ceramic substrate.

6. The packaged power semiconductor device as in claim 1 wherein the encapsulant is configured in a TO-247 package configuration.

7. The packaged power semiconductor device as in claim 1 wherein:
   the semiconductor die includes an insulated gate bipolar transistor (IGBT); and
   the plurality of electrically conductive leads attached along an edge of the upper electrically conductive layer include three leads with a first lead soldered to the upper electrically conductive layer, and second and third leads wire bonded to the IGBT.

8. The packaged power semiconductor device as in claim 2 further comprising:
   a heat sink;
   an attaching device which extends through the hole to secure the packaged power semiconductor device to the heat sink, and wherein
   the protrusion allows the attaching device to bias the lower electrically conductive layer against the heat sink to enable improved thermal conductivity.

9. The packaged power semiconductor device as in claim 8 wherein the attachment device comprises a threaded fastener which pulls the packaged power semiconductor device against the heat sink.

10. The packaged power semiconductor device as in claim 1 wherein the ceramic substrate comprises alumina and each of the upper electrically conductive layer and the lower electrically conductive layer comprise copper.

11. The packaged power semiconductor device as in claim 10 wherein the generally rectangular power semiconductor device is attached to the upper electrically conductive layer with solder.

12. A packaged power semiconductor device comprising:
   a ceramic substrate having an upper and lower surface on opposite sides thereof;
   an upper electrically conductive layer bonded to the upper surface of the ceramic substrate;
   a lower electrically conductive layer bonded to the lower surface of the ceramic substrate;
   a plurality of electrically conductive leads attached along an edge of the upper electrically conductive layer;
   a semiconductor device attached to the upper electrically conductive layer, the semiconductor device having a longer dimension arranged to be parallel to the edge of the upper electrically conductive layer;
   a region of encapsulating material disposed to cover the semiconductor device, the ceramic substrate and the upper electrically conductive layer, the encapsulant not covering a major surface of the lower electrically conductive layer, and leaving at least a portion of each of the plurality of electrically conductive leads exposed and extending from the encapsulant;

the encapsulating material extending away from the plurality of electrically conductive leads in a direction parallel to the edge of the upper electrically conductive layer to thereby provide an extended region of encapsulant having an upper surface, a lower surface, an end surface opposite the edge of the upper electrically conductive layer, and side surfaces;

a hole extending through the extended region of encapsulant from the upper surface of the extended region of encapsulant to the lower surface of the extended region of encapsulant thereof to enable attachment of the packaged power semiconductor device to a mount; and a protrusion on the lower surface of the extended region of encapsulant at the end surface; a first notch in the extended region of the encapsulant, the first notch extending into the encapsulant from the upper surface of the extended region encapsulant and one of the side surfaces toward the hole, and extending toward the ceramic substrate.

13. The packaged power semiconductor device as in claim 12 wherein the protrusion extends across the lower surface of the extended region encapsulant between the side surfaces at the end surface.

14. A packaged power semiconductor insulated gate bipolar transistor (IGBT) device comprising:
   a direct bonded copper substrate including a ceramic substrate having an upper and lower surface on opposite sides thereof;
   a first copper layer bonded to the upper surface of the ceramic substrate;
   a second copper layer bonded to the lower surface of the ceramic substrate;
   three electrically conductive leads attached along an edge of the first copper layer;
   an IGBT semiconductor device having a pair of longer sides and a pair of shorter sides, the IGBT being soldered to the upper electrically conductive layer in an orientation with the longer sides being parallel to the edge of the first copper layer to which the three electrically conductive leads are attached;
   a region of encapsulating material disposed in a TO-247 compliant format to cover the IGBT, the ceramic substrate and the first copper layer, the encapsulant not covering a bottom surface of the second copper layer, and leaving at least a portion of each of the three electrically conductive leads exposed and extending from the encapsulant;
   the encapsulating material extending away from the three electrically conductive leads in a direction parallel to the edge of the first copper layer to thereby provide an extended region of encapsulant;
   a hole extending through the extended region of encapsulant from an upper surface of the extended region of encapsulant to a lower surface of the extended region of encapsulant thereof to enable attachment of the packaged power semiconductor device to a heat sink; and
   a protrusion on the lower surface of the extended region of encapsulant to facilitate improved thermal contact between the bottom surface of the second copper layer and the heat sink when the packaged power semiconductor insulated gate bipolar transistor (IGBT) device is affixed to the heat sink a first notch in the extended region of the encapsulant, the first notch extending into the encapsulant from the upper surface of the extended region encapsulant and one of the side surfaces toward the hole, and extending toward the ceramic substrate.

* * * * *